United States Patent [19]

Ikeda et al.

[11] Patent Number: 4,886,647
[45] Date of Patent: Dec. 12, 1989

[54] SUPPORTING APPARATUS FOR SEMICONDUCTOR CRYSTAL ROD

[75] Inventors: Yasuhiro Ikeda; Kouji Mizuishi, both of Annaka, Japan

[73] Assignee: Shin-Etsu Handotai Co., Ltd., Gunma, Japan

[21] Appl. No.: 133,791

[22] Filed: Dec. 16, 1987

[30] Foreign Application Priority Data

Apr. 27, 1987 [JP] Japan .................. 62-103820

[51] Int. Cl.$^4$ ............... C30B 13/00; C30B 13/14; C30B 35/00
[52] U.S. Cl. ....................... 422/250; 156/620.7; 156/620.73; 156/620.74; 248/406.2; 248/184; 108/102; 108/143; 108/157
[58] Field of Search ........... 156/620.7, 620.73, 620.74; 422/250; 248/406.2, 429, 184, 286; 108/102, 106, 137, 143, 157

[56] References Cited

U.S. PATENT DOCUMENTS

| Re. 29,824 | 11/1978 | Keller | 156/620.73 |
|---|---|---|---|
| 3,961,906 | 6/1976 | Keller | 156/620.73 |
| 4,045,183 | 8/1977 | Barowski et al. | 156/620.73 |
| 4,060,392 | 11/1977 | Herzer et al. | 422/250 |
| 4,186,173 | 1/1980 | Jericho et al. | 156/620 |
| 4,257,841 | 5/1981 | Russ et al. | 422/250 |

FOREIGN PATENT DOCUMENTS

| 2515850A | 10/1976 | Fed. Rep. of Germany . | |
|---|---|---|---|
| 2529366A1 | 1/1977 | Fed. Rep. of Germany . | |
| 2529366 | 1/1977 | Fed. Rep. of Germany . | |
| 2626311 | 12/1977 | Fed. Rep. of Germany | 156/620.73 |
| 2626377 | 12/1977 | Fed. Rep. of Germany | 156/620.73 |
| 2853414 | 6/1980 | Fed. Rep. of Germany | 422/250 |
| 2853415 | 6/1980 | Fed. Rep. of Germany | 422/250 |
| 2306736 | 11/1976 | France . | |
| 159088 | 2/1983 | German Democratic Rep. | 422/250 |
| 233595 | 3/1986 | German Democratic Rep. | 422/250 |
| 235679 | 5/1986 | German Democratic Rep. | 422/250 |
| 51-133106 | 12/1976 | Japan . | |
| 52-6310 | 1/1977 | Japan . | |
| 57-50754 | 10/1982 | Japan . | |
| 60-48479 | 10/1985 | Japan . | |
| 62-153185 | 7/1987 | Japan | 156/620.73 |
| 915882 | 1/1963 | United Kingdom | 156/620.73 |
| 1478006 | 4/1975 | United Kingdom . | |

Primary Examiner—Gary P. Straub
Attorney, Agent, or Firm—Lowe, Price, LeBlanc, Becker & Shur

[57] ABSTRACT

A supporting apparatus for a semiconductor noncrystal rod comprises a movable ring adapted to move freely in horizontal directions unless it is engaged with the monocrystal rod, a lock means to prevent the movable ring from horizontally moving, and a drive means to elevate the movable ring.

11 Claims, 3 Drawing Sheets

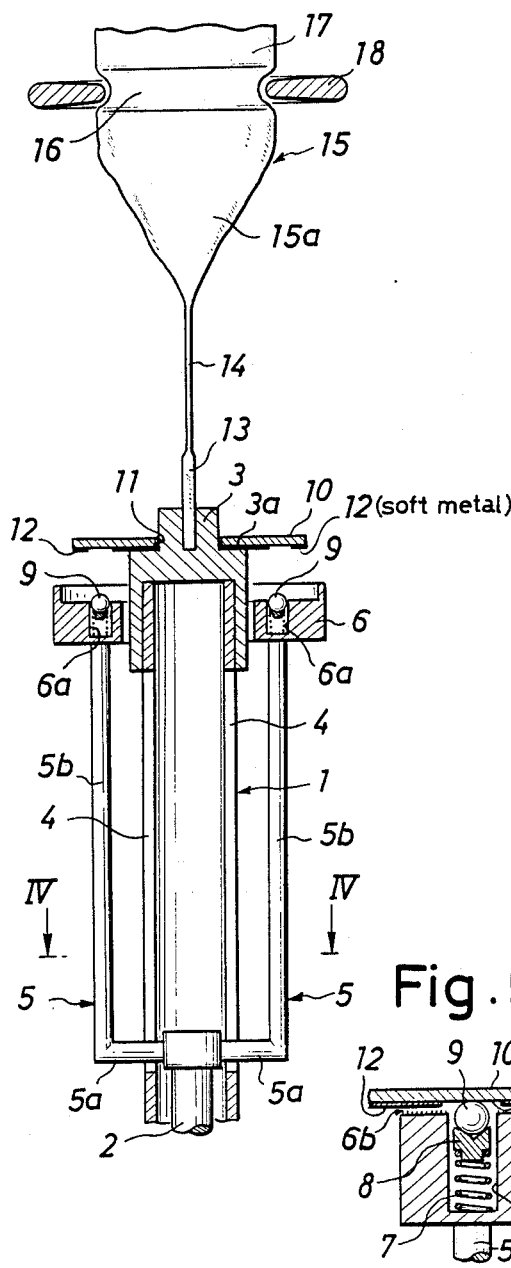
Fig. 1
Fig. 5
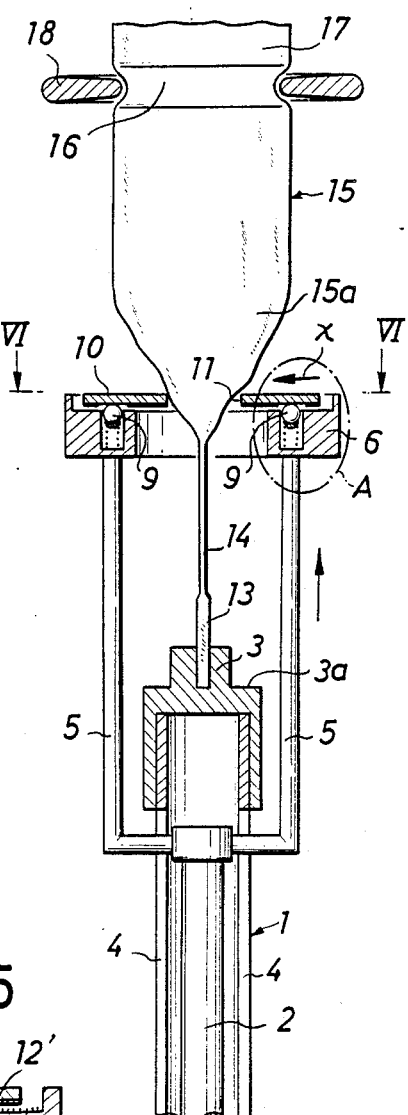
Fig. 2

Fig. 8
Fig. 9
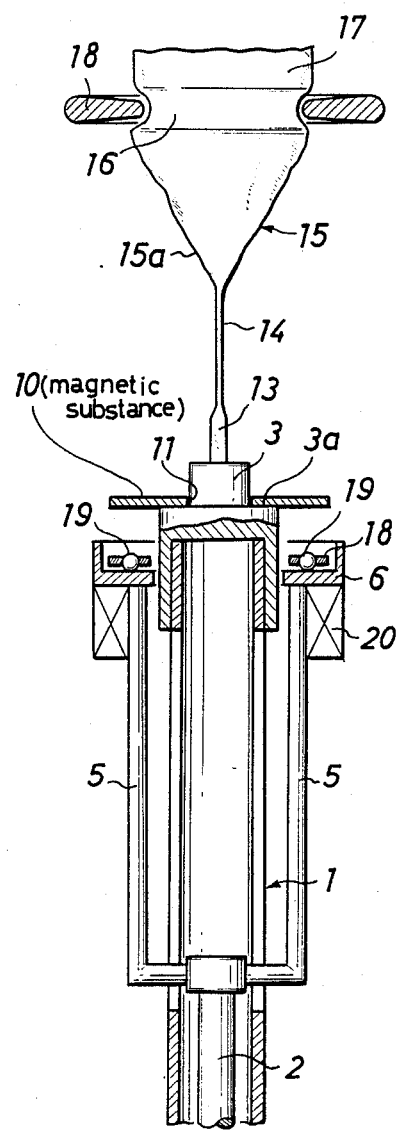
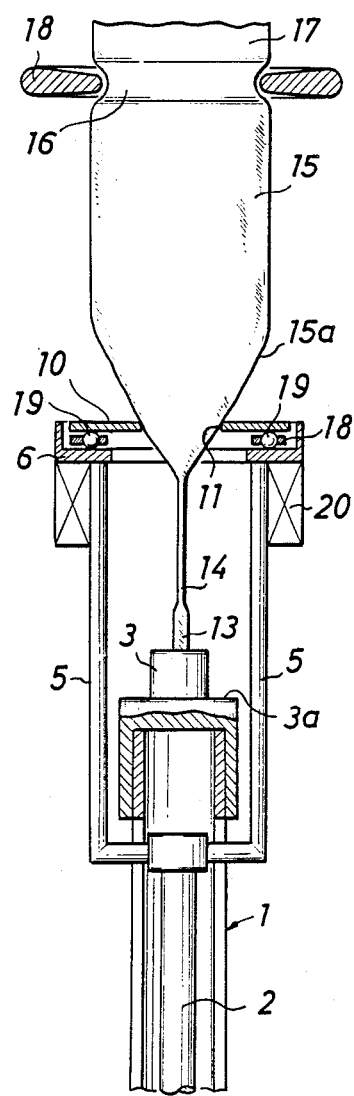

SUPPORTING APPARATUS FOR SEMICONDUCTOR CRYSTAL ROD

BACKGROUND OF INVENTION

This invention relates to a supporting apparatus adapted to support a semiconductor monocrystal rod grown by the floating zone (FZ) method.

The so-called FZ method is often adopted in a process for production of a semiconductor monocrystal rod. This method is effective in turning a polycrystal rod (such as a polycrystal silicon rod prepared through vapour-phase growth of silicon based on thermal decomposition or reduction of a substance containing silicon, or by simply casting silicon into a rod) into a highly-purified monocrystal rod. To achieve this effect, the FZ method employs a heating means such as an induction heating coil to heat a vertically held polycrystal rod. The heating means heats only a small portion of the rod into a narrow melted zone at a time, but as the vertically held rod is slowly lowered passing the heating means, the molten zone sweeps the whole length of the rod, starting at the joint with a seed, to eventually turn it into a pure monocrystal rod. The impurities are more apt to be solved in the melted zone than to stay in the solidifying portions, so that the melted zone collects the impurities as it sweeps the rod upward. Hence, the resultant monocrystal rod is free from impurities.

In this process of monocrystalization, the melted portion of the rod forms a so-called floating zone between the unmelted portions of the rod and is held therebetween by its surface tension and the electromagnetic force against gravity. As the floating zone travels upward in the rod accompanying the downward movement of the rod relative to the heating means, the portion which previously was a part of the floating zone solidifies to form a part of the monocrystal rod.

Incidentally, the FZ method utilizes a thin seed crystal to provide the starting source for the growth of the monocrystal rod. The polycrystal rod is suspended from above and its lower end is melted to merge with the upper tip of the seed crystal. As the monocrystal starts growing from the seed crystal, it forms a contracted thread-like portion before it begins growing into a conical portion. Although the polycrystal rod is suspended from above, the newly formed monocrystal portion of the rod, i.e. the portion below the floating zone, is supported via the thread-like portion and the thin seed crystal, so that as the monocrystal portion grows longer it becomes so heavy that even a slight vibration may cause the melt to drip and, in an extreme case, cause the thread-like portion or even the seed crystal to break. Hence, it is necessary to support the monocrystal portion of the rod by a means in addition to the seed crystal.

Several supporting apparatuses for this purpose have been proposed by, e.g. Japanese Provisional Patent Publication (Kokai) No. 52-6310, Japanese Patent Publication No. 57-50754, and Japanese Patent Publication No. 60-48479, but these apparatuses necessitate enlargement of the unit in which they are installed, and in terms of the stability of the monocrystal rod they support, they are yet unsatisfactory.

SUMMARY OF INVENTION

The invention as claimed is intended to remedy these drawbacks of the prior art apparatuses. It discloses a small, compact supporting aparatus for growing semiconductor monocrystals, so small that there is no need of increasing the size of the unit in which the apparatus is installed, and with the aid of the apparatus of the invention the monocrystal rod is held so firmly that it is unshaken by vibration.

More particularly, according to the invention, the movable ring is normally unlocked and can freely move horizontally, and as the drive means moves the movable ring upward, at first a point on the inner edge of the ring is touched by the tapered side of the conical portion of the monocrystal rod and then the movable ring is urged at the point to slide horizontally until the ring is touched by the rod at three points in all, that is, until the ring finds its most suitable position to snugly receive the rod. Once the three points are thus determined, the ring does not move horizontally, and soon a lock means works to lock the ring to prevent its horizontal movement. As a result, the rod is firmly received by the horizontal movable ring such that the rod receives no biasing force from the ring and at the same time has no freedom of horizontal movement. Consequently, no ordinary vibration can shake and break the rod. Also the supporting apparatus of the invention merely requires the vertical movement of its constituting parts, so that the apparatus requires only small installation space and can be a small, compact apparatus itself.

BRIEF DESCRIPTION OF DRAWINGS

These and other objects as well as advantages of the present invention will become clear by the following description of preferred embodiments of the present invention with reference to the accompanying drawings, wherein;

FIG. 1 is a longitudinal sectional view of a supporting apparatus embodying the invention at resting position;

FIG. 2 is a longitudinal sectional view of the same supporting apparatus shown in FIG. 1 after the first contact;

FIG. 5 is an enlarged view of a portion A in FIG. 2;

FIG. 8 is a longitudinal sectional view of a second supporting apparatus embodying the invenion at resting position; and FIG. 9 is a longitudinal sectional view of the same supporting apparatus shown in FIG. 8 at locked position.

DESCRIPTION OF INVENTION

Figure 3:
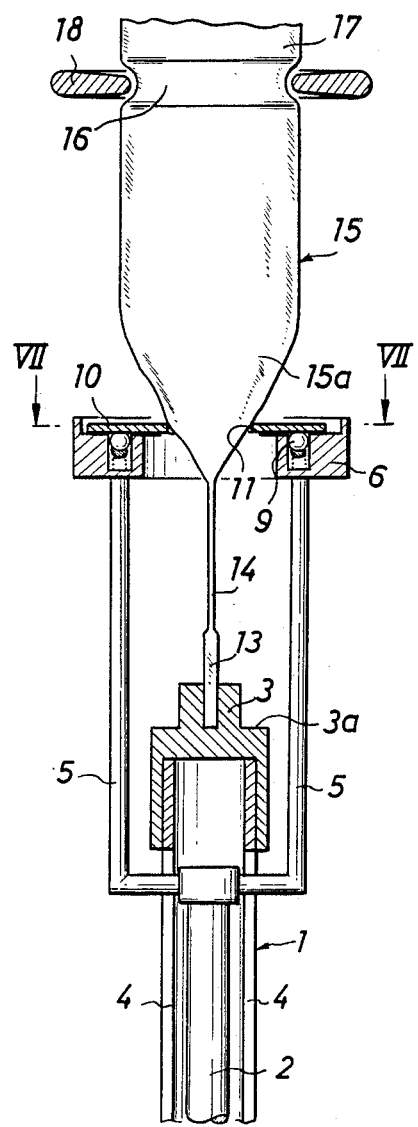
FIG. 3 is a longitudinal sectional view of the same supporting apparatus shown in FIG. 1 at locked position.

Two ways of carrying out the invention are described in detail below with reference to drawings which illustrate the specific embodiments.

FIG. 1 is a cross-sectional view of a supporting device in accordance with the invention, wherein reference numeral 1 designates a vertically standing hollow shaft, which contains a coaxial inner shaft 2 therein. The bottoms of these shafts 1, 2 are connected to a motor-driven rotary drive means (not shown) devised such that the shafts 1, 2 are rotated at the same constant slow speed around their common axis. The inner shaft 2 alone is held by another drive means also, such as a low-pressure hydraulic cylinder, which displaces the shaft 2 vertically at a constant low speed. Therefore, the two drive means together can cause the two shafts 1, 2 to move such that while they rotatate together at an equal speed, the shaft 2 moves upward or downward relative to the shaft 1. (Here it should be reminded that, as explained earlier concerning the FZ method, the whole system shown in FIG. 1 excluding the fixed heating device 18 is lowered slowly as the single crystal 15 grows.)

Figure 4:
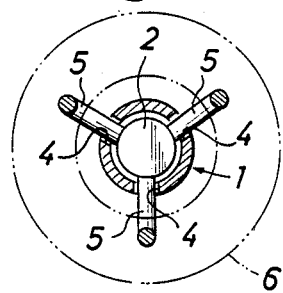
FIG. 4 is a section taken on line IV—IV in FIG. 1.

The upper end of the shaft 1 is tightly received in a seed holder 3. The shaft 1 has three vertical slits 4, which are equiangularly spaced from each other, as seen in FIG. 4. Fixed at the upper end of the shaft 2 are three L-shaped rods 5, which are equiangularly arranged such that each rod 5, extending horizontally (radially) from the top of the shaft 2, passes through the respective slit 4 (FIG. 4) and then, bending upwardly, extends vertically. Incidentally, the slits 4 extend as high as the lower end of the seed holder 3, and as low as the configuration shown in FIG. 1 is possible, that is, low enough to allow the L-shaped rods 5 to go down until a substantial space is formed between a ring 10 and a ring 6, hereinafter described.

The upper ends of the three rods 5 bear a support ring 6 horizontally. At least three equiangularly spaced pits 6a are formed in the upper face of the support ring 6, and, as seen most clearly in FIG. 5, each pit 6a contains in it a vertically placed spring 7 and a ball 9 seated on a lubricated seat 8, which is fixed on the top of the spring 7, so that the ball 9 has a freedom of vertical movement, by virtue of the spring 7, as well as spinning movement. The length of the spring 7 is such that, when it is released (FIG. 1) a small portion of the ball 9 peeps from the pit 6a.

The upper surface of the support ring 6 is planted with numerous minute needles 6b, shown only in FIG. 5, so that the frictional resistance of the surface is considerably increased.

Figure 6:
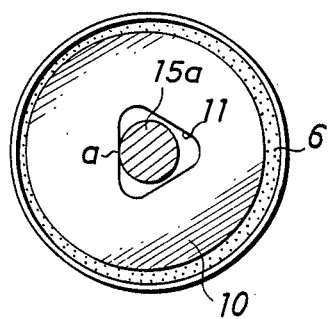
FIG. 6 is a section taken on line VI—VI in FIG. 2.

The seed holder 3 has a coaxially formed step 3a on which a movable ring 10 can alight (FIG. 1). The movable ring 10 is a thin plate with a round cornered triangular vacancy 11 bored in the center (FIG. 6). Preferably, the movable ring 10 is made of a hard material, such as ceramics or a hard metal. The ring 10 has its bottom face, excluding the circular zone 12' where the balls 9 are likely to come in contact with the ring 10, coated with soft metal 12, such as silver or copper.

The seed holder 3 holds the seed crystal 13 in such a manner that the seed crystal 13 is vertically planted in the center of the top of the seed holder 3. The seed crystal 13, as the monocrystallization proceeds upwardly, sprouts a thread-like portion 14, and then grows into a conical portion 15a. Between a monocrystal rod 15 and a polycrystal rod 17 is a melted zone 16 shifting upward as the monocrystal rod grows. The upper end of the polycrystal rod 17 is held by a holding device such as a pneumatic clutch, not shown, which imparts to the crystal rod 17 vertical rectilinear motion as well as rotary motion. The heating device 18 is a high-frequency heating device connected to a high-frequency generator, not shown.

Next, the operation of the first embodiment of the supporting device according to the invention will be explained.

In FIG. 1 it is seen that the formation of the conical portion 15a of the monocrystal rod 15 has been completed; and until this completion the supporting apparatus of the invention remains resting well below the movable ring 10 lest it should interfere with the growth of the thread-like portion 14 and the conical portion 15a.

When the monocrystal rod 15 has grown longer than a certain predetermined length, the inner shaft 2 is displaced upward by the drive means, and then as the balls 9 come in contact with the movable ring 10, the support ring 6 lifts the movable ring 10 from the step 3a of the seed holder 3 (FIG. 2). Incidentally, the resiliency of the springs 7 and the weight of the movable ring 10 are such that, on this occasion, the horizontally borne movable ring 10 is touched only by the balls 9. Therefore, in the state of FIG. 2, the movable ring 10 can freely move horizontally.

Figure 7:
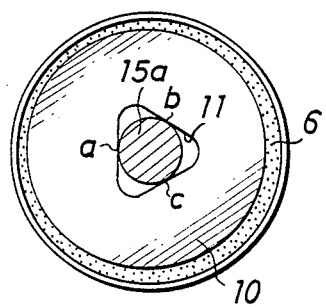
FIG. 7 is a section taken on line VII—VII in FIG. 3.

As the support ring 6 ascends higher, a point a on the inner edge of the support ring 6 comes in contact with the tapered side of the conical portion 15a of the monocrystal rod 15 (FIGS. 2 and 6). Then, a further ascent of the supporting ring 6 causes the conical portion 15a to move the movable ring 10 in the direction indicated by the arrow x in FIG. 2, to thereby allow further smooth ascending of the support ring 6. Then another point b comes in contact with the conical portion 15a, whereupon the movable ring 10 is pushed in a horizontal direction of diminishing the clearance between the conical portion 15a and the remaining untouched side of the round cornered triangular vacancy 11. Thus, a third point c comes in contact with the conical portion 15a (FIG. 7), and as a result, the conical portion 15a is fittedly received in the movable ring 10.

Once the three points a, b, c are thus determined the conical portion 15a prevents the movable ring 10 not only from moving horizontally but also from ascending further. Thus the ring 10 depresses the balls 9 into their respective pits, whereupon the ring 10 lies on the support ring 6. Since the bottom face of the ring 10 is coated with a soft metal and the top face of the ring 6 is planted with numerous minute needles, the ring 10 is frictionally locked by the ring 6 so that it cannot slide on the ring 6 to change its position; thus the monocrystal rod 15 is stably supported by the ring 6 via the ring 10.

It is believed that the position of the movable ring 10 thus determined is such that the weight of the monocrystal rod 15 is nearly equally distributed among the three supporting points a, b, c, which is tantamount to say that the monocrystal rod 15 receives little biasing stress from the movable ring 10.

Incidentally, the drive means to vertically drive the inner rod 2 is so devised that when, during its upward drive, it receives a load greater than a predetermined amount, it automatically stops driving the rod 2. Thus, when the state of FIG. 3 is realized the support ring 6 no longer ascends.

Now, a second embodiment of the invention is described below with reference to FIGS. 8 and 9. Those elements in the second embodiment that have their counterparts in the first are designated by the same reference numerals as their counterparts, and their explanation is omitted.

In FIG. 8, a ball holder 18 which is a ring carrying many balls 19 in it is placed on a support ring 6.

An annular electromagnet 20 is provided on the bottom face of the support ring 6. The movable ring 10, the balls 19, and the ball holder 18 are made of magnetic substance so as to be attracted by the electromagnet 20.

Next, the operation of the second embodiment of the supporting device according to the invention will be explained. Until the growth of the conical portion 15a of the monocrystal rod 15 has been completed, the support ring 6 and thus the ball holder ring 18 stay well below the movable ring 10 (FIG. 8). When the conical portion 15a is formed, the inner rod 2 starts rising to thereby bring the balls 19 into contact with the bottom face of the movable ring 10. Then the movable rings 10, lifted from the step 3a, comes in contact with the conical portion 15a of the monocrystal rod 15, in the similar manner as stated in connection with the first embodiment. Once the movable ring 10 is snugly caught by the conical portion 15a, the inner rod 2 receives an increased load via the L-shaped rods 5, whereupon the inner rod 2 automatically ceases to rise, and at the same time the electromagnet 20 is automatically energized to fasten the movable ring 10, the balls 19 and the ring 18, so that they are kept where they are and unshaken by vibration.

According to the embodiments described above, the monocrystal rod is firmly received by the horizontal movable ring such that the rod receives no biasing force from the ring and at the same time has no freedom of horizontal movement. Consequently, no ordinary vibration can shake and break the rod. Also the supporting apparatus of the invention merely requires the vertical movement of its constituting parts, so that the apparatus requires only small installation space and can be a small, compact apparatus itself.

What is claimed is:

1. A supporting apparatus for a semiconductor monocrystal rod being grown based on the floating zone method, comprising a movable ring adapted to move freely in horizontal directions unless it is engaged with a conical portion of said monocrystal rod, a lock means including means for increasing frictional resistance to prevent said movable ring from horizontally moving, and a drive means to elevate said movable ring.

2. A supporting apparatus for a semiconductor monocrystal rod as claimed in claim 1, wherein said movable ring has a triangular vacancy in the center.

3. A supporting apparatus for a semiconductor monocrystal rod as claimed in claim 1, wherein said lock means comprises soft metal coated on the bottom face of said movable ring and numerous minute needles planted in the upper face of a support ring which supports said movable ring.

4. A supporting apparatus for a semiconductor monocrystal rod as claimed in claim 1, wherein said movable ring is made of magnetic substance, and said lock means comprises an electromagnetic adapted to fasten said movable ring.

5. In a apparatus for growing semiconductor monocrystals based on the floating zone method, a support for said monocrystal comprising a movable ring adapted to move freely in horizontal directions, a lock means including means for increasing frictional resistance to prevent said movable ring from horizontally moving when said ring engages a conical portion of said semiconductor monocrystal and a drive means to elevate said movable ring, thereby disengaging said lock means when said ring is not in contact with said semiconductor monocrystal.

6. An apparatus as claimed in claim 5, wherein said lock means comprises soft metal coated on the bottom face of said movable ring and numerous minute needles affixed to the upper surface of a support ring which supports said movable ring.

7. An apparatus as claimed in claim 5, wherein said movable ring is made of a magnetic substance, and said lock means comprises an electromagnet adapted to be magnetically coupled with said movable ring.

8. For a semiconductor monocrystal rod being grown based on the floating zone method, having a vertically movable heating coil through which a polycrystal rod is positioned to pass and to be processed into a monocrystal rod, a lower portion of said rod being conical, a supporting apparatus for said rod comprising:
   a horizontally shiftable support ring;
   means for moving said support ring upward into contact with the conical portion of said rod, said support ring shifting horizontally into a centered horizontal position about said conical portion of said rod as said ring is moved into contact therewith; lock means including means for increasing frictional resistance for securing said ring into said centered position and
   means for disengaging said lock means when said rod is not in contact with said shiftable support ring.

9. A supporting apparatus for a semiconductor monocrystal rod as claimed in claim 8, wherein said movable ring has a triangular vacancy in the center.

10. A supporting apparatus for a semiconductor monocrystal rod as claimed in claim 8, wherein said lock means comprises soft metal coated on the bottom face of said movable ring and numerous minute needles planted in the upper face of a support ring which supports said movable ring.

11. A supporting apparatus for a semiconductor monocrystal rod as claimed in claim 8, wherein said movable ring is made of magnetic substance, and said lock means comprises an electromagnet adapted to fasten said movable ring.

* * * * *